United States Patent [19]

Degges

[11] Patent Number: 5,396,520
[45] Date of Patent: Mar. 7, 1995

[54] DIGITAL RF RECEIVER

[75] Inventor: Andrew M. Degges, Greensboro, N.C.

[73] Assignee: Dial Page LP, Greenville, S.C.

[21] Appl. No.: 921,936

[22] Filed: Jul. 29, 1992

[51] Int. Cl.$^6$ .................... H04L 27/06; H03K 9/00
[52] U.S. Cl. ................................ 375/316; 375/345; 375/350
[58] Field of Search ............... 375/75, 98, 109, 103, 375/11, 96; 455/234, 234.2, 234.1; 358/143, 174

[56] References Cited

U.S. PATENT DOCUMENTS

| | | |
|---|---|---|
| 4,583,239 | 4/1986 | Vance . |
| 4,625,240 | 11/1986 | Yablonski et al. ............... 358/143 |
| 4,726,040 | 2/1988 | Acampora . |
| 4,733,403 | 3/1988 | Simone ............................ 375/103 |
| 4,789,995 | 12/1988 | Hurst et al. ..................... 375/75 |
| 4,811,362 | 3/1989 | Yester, Jr. et al. . |
| 4,922,509 | 5/1990 | Tresset et al. ................... 375/103 |
| 4,995,057 | 2/1991 | Chung ............................. 375/109 |
| 5,029,182 | 7/1991 | Cai et al. ......................... 375/98 |
| 5,048,059 | 9/1991 | Dent . |
| 5,073,904 | 12/1991 | Nakamura et al. . |
| 5,187,809 | 2/1993 | Rich et al. ....................... 375/98 |

Primary Examiner—Stephen Chin
Assistant Examiner—Don Vo
Attorney, Agent, or Firm—Dority & Manning

[57] ABSTRACT

A digital RF receiving system is provided for processing relatively weak analog signals transmitted in a noisy environment. The system includes a receiver for filtering and mixing the incoming signal. Automatic gain control components are provided for digitally attenuating the signal before processing by the receiver so that useful information contained in the signal will not be lost due to saturation of the amplifier within the receiver. The automatic gain control components include a high speed A/D converter, digital processor, and digital attenuator driven by the digital process in response to the signal received from the high speed A/D converter. A second relatively high speed A/D converter samples and digitizes the output signal from the receiver at a relatively high rate. A microprocessor is included for digitally filtering and processing the digitized signal from the A/D converter into useful digital information. The microprocessor further includes an auto-recursive loop for flushing valid binary data from the digitized signal. The auto-recursive loop drives a segment of the digitized signal through digital filters and predetermined number of passes with the band width of the filters being shifted prior to each pass therethrough. Valid binary data is converted to RS 232 serial output.

28 Claims, 3 Drawing Sheets

DIGITAL RF RECEIVER

BACKGROUND OF THE INVENTION

The present invention relates to RF receivers and in particular to an apparatus and method within a long range RF telemetry system for receiving and demodulating, using digital components, weak signals in the presence of narrow band and wide band interference.

Conventional paging systems typically consist of a central transmitter system and small portable receivers. The receivers typically do not transmit an acknowledgement that the message was received. The portable receivers are small and lightweight. However, a significant increase in size and weight would be required, using conventional technology, to enable these receivers to transmit a detectable acknowledgement back to the source of the original message.

Small, lightweight transmitters can be installed in a portable receiver such that the system remains marketable. The problem is that power is sacrificed for the reduction in size of the transmitter. Therefore, the transmission of the acknowledgement signal would only be reliable at short distances from the source of the original message or receiving station. In order for such an acknowledgement paging system to be reliable, it must be able to receive and process the weak signals over a long range in the presence of substantial interference. Conventional systems have not achieved this.

The use of direct Frequency Shift Keying (FSK) as a method of narrow band carrier modulation has been increasing steadily since the early 1980's. Its prevalence as a medium for telemetric signalling and general intelligence transmission stems in large measure from the ease with which it may be demodulated and converted to standard data protocol (i.e., RS232c). Unfortunately as FSK's use has increased, the spectrum allocated for its use has just as steadily decreased, with the end result being that co-channel interference has become a serious threat to once reliable reception. The inability of conventional discriminators and detectors to achieve capture of a signal with less than a 4:1 relative signal strength ratio is becoming a serious barrier to reliable communication, particularly from weak sources.

Devices and methods are known in the art for the demodulation of RF signals using digital technology. For example, U.S. Pat. No. 4,811,362 to Yester et al. discloses a low power digital receiver which automatically adjusts the level of the incoming RF signal, then digitizes the signal at variable sampling rates in order to minimize power consumption. The primary concern of the Yester device is to reduce the power consumption of the receiver.

The Yester device automatically adjusts the level of the incoming signal as necessary so that large signals will not be "clipped" by a saturated amplifier or A/D converter. If an analog signal is "clipped" by an amplifier, information above a certain amplitude is lost. "Clipping" by an A/D converter causes the production of a fixed output from the converter, regardless of input signal. A significant drawback with this device is that a delay exists before the incoming signal is attenuated. That is, before the system can react to a large incoming signal, part of that signal has been clipped. Therefore information has been lost.

Moreover, once the digital signal is recovered, it is processed by a D/A converter (See column 6, lines 48 to 51) followed by audio circuits. The level of interference that is tolerable in this type circuit is greater relative to a system in which the recovered signal must be processed entirely by digital circuits. As a result, the Yester device could not adequately digitally process the signal.

The method and apparatus of the present invention represent a novel technique for receiving weak RF signals in the presence of interference using digital circuitry. The prior art neither teaches nor suggest the method or apparatus according to the present invention.

OBJECTS AND SUMMARY OF THE INVENTION

It is a principle object of the present invention to provide a digitally enhanced RF receiving system for receiving and processing useful information from a relatively weak RF signal.

Another object of the present invention is to provide a discriminator circuit for digitally processing a RF signal in a noisy environment.

And yet another object of the present invention is to provide a relatively fast digital processor having applications in the long range RF telemetry field.

And still another object of the present invention is to provide a system and method for maximizing the benefits of DSP technology combined with conventional receiver circuitry for processing received analog signals.

Yet another object of the present invention is to provide a system and apparatus having precise tone decoding or detection capability of relatively weak signals in a noisy environment.

And still a further object of the present invention is to provide a RF receiving system having applications in the personal paging market, particularly an acknowledgement paging system.

Yet another object of this invention is to provide a RF data transfer system capable of processing useful information from relatively weak analog signals.

A still further object of the present invention is to provide a digital receiver for receiving and demodulating weak signals in the presence of narrow band and wide band interference effectively increasing the signal to noise ratio magnitudes greater than known conventional techniques.

Still another object of this invention is to provide a dynamically recursive digital discriminator for the demodulation of FM (frequency modulation) radio signals.

And yet another object of the present invention is to provide a dynamically recursive digital discriminator circuit for the demodulation of bicromatic monotonic AM radio signals.

Another object of this invention is to provide a personal acknowledgement paging system incorporating a relatively small and weak acknowledgement transmitter with a portable receiver whereby a digitally enhanced receiving system can process the acknowledgement signal from the personal transmitter in a relatively noisy environment.

And still another object of the present invention is to provide automatic digital gain control to a receiver to prevent loss of useful information due to clipping of the signal in the receiver.

Another object of the present invention is to combine digital signal processor technology with conventional analog receivers to provide an improved system for processing analog signals.

To achieve the objects and in accordance with the purpose of the invention, as embodied and broadly described herein, a digitally enhanced RF receiving system for receiving and demodulating signals in a noisy environment is provided. The system includes receiver circuitry, such as a heterodyne receiver, for filtering and mixing an incoming analog signal to a desired predetermined frequency. Automatic gain control means are provided for attenuating the incoming signal before it is processed by the receiver circuitry means so that any useful information contained in the incoming signal will not be lost due to saturation of the receiver. Converter means, such as an analog-to-digital (A/D) converter for sampling and digitizing the output signal from the receiver is also provided. The converter means preferably samples the signal at a rate of at least the Nyquist frequency, most preferably at one and a half times the Nyquist frequency. Finally, digital circuitry means, such as an array of digital signal processors, is provided for processing the digitized signal from the converter means into useful digital information. The digital circuitry means also controls the automatic gain control means to prevent saturation of the receiver circuitry and undesired clipping of the incoming signal.

In a preferred embodiment of the system, the automatic gain control means comprises a digital attenuator operatively upstream from the receiver. A "flash" A/D converter is provided to sample the output from the digital attenuator at as a high a rate as possible. A gain control digital processor is provided in operative communication with the flash A/D converter and the digital attenuator, with the flash A/D converter sampling at the maximum rate compatible with the gain control digital processor. The gain control digital processor receives the sampled and digitized signal from the flash A/D converter and drives the digital attenuator in response to the strength level of the digitized signal. In one preferred embodiment, the receiver circuitry means comprises at least a first and a second mixing/intermediate frequency stage, with the flash A/D converter sampling the output of the second IF stage.

Preferably, the system may also include a variable gain amplifier driven by the gain control digital processor for providing variable gain to the output signal of the receiver, the amount of gain being matched to the level of the incoming signal.

The converter means according to the invention preferably comprises a sampling A/D converter for sampling the output of the receiver at a relatively high rate, in a preferred embodiment at least one and half times the Nyquist rate. The receiver may include a third IF stage for mixing the signal down to a preferred frequency for subsequent digitizing by the sampling A/D converter. In another preferred embodiment, the third IF stage is not needed and the sampling A/D converter samples the output of the receiver at a rate of at least the Nyquist rate with the system further comprising an anti-aliasing filter upstream from the digital circuitry means. In still another preferred embodiment, the sampling A/D converter undersamples the output of the receiver at a sub-Nyquist rate. This embodiment may be used, for example, when the incoming signal is a monotonic AM signal. Sub-Nyquist sampling is possible because FSK modulation is actually bicromatic monotonic AM (amplitude modulation). Thus, with a band-limited excursion of 5 khz, it is possible to sample at a 20 khz rate and dispense with the third IF section in the receiver even though the Nyquist rate is in excess of 200 times the sampling rate.

In a preferred embodiment of this invention, the digital circuitry means comprises a first multi-band FIR (finite impulse response) filter section, a second narrow band FIR filter section, and a third matched filter section. These filter sections are preferably comprised of an array of digital signal processors. In a preferred embodiment, to increase the speed of the system and minimize ringing, the narrow band filter section is comprised of two filters configured in parallel. These parallel FIR filters may further comprise at least two digital signal processors operating in parallel. In a preferred embodiment three digital signal processors are configured in parallel for each narrow band FIR filter. It is preferred to utilize parallel DSP architecture with a high speed sampling A/D converter to achieve the objects of the present invention.

The system of the present invention also preferably comprises auto-recursive means for flushing valid binary data from the received and digitized signal by passing the signal through the filtering means a predetermined number of passes. The band width of the respective filters are shifted for each respective pass to locate any useful data contained in the digitized signal. The amount of digitized signal passing through the auto-recursive loop is defined by the aperture window of the sampling A/D converter.

In a preferred embodiment of the narrow band FIR filters according to the invention, parallel DSP computers execute the convolution sum required to implement a 540 tap FIR bandpass filter having a Q rating greater than 200 that substantially eliminates ringing within the circuit.

Preferably, the present system may also include a buffer for storing valid binary data extracted from the digitized received signal, and means for outputting the binary data as serial data.

The method according to the present invention includes the steps of inputting a RF signal into a receiver and attenuating the signal prior to the inputting thereof with a digital attenuator driven by a digital processor so as to prevent saturation of the receiver and the loss of useful information carried by the signal. After processing the attenuated signal with the receiver, the signal is sampled and digitized with a relatively high speed sampling A/D converter at a predetermined rate, preferably at least the Nyquist frequency. The digitized signal is then routed from the sampling A/D converter through a multi-pass loop a predetermined number of passes, the loop comprising an array of digital processors configured as a multi-bandpass FIR filter section, a narrow band FIR filter section, and a matched filter section to flush valid binary data from the digitized signal. Finally, the valid binary data is stored in a buffer for output as serial data for further processing.

The present method preferably includes utilizing a variable gain amplifier driven by the automatic gain control digital processor for increasing the level of the signal emerging from the receiver to an adequate strength for processing by the sampling A/D converter.

The accompanying drawings, which are incorporated in and constitute a part of the specification illustrate one embodiment of the invention and, together with the description, serve to explain the principles of the invention.

BRIEF DESCRIPTION OF THE DRAWINGS

A full and enabling disclosure of the present invention, including the best mode thereof, directed to one or ordinary skill in the art, is set forth in the remainder of the specification, which makes reference to the appended figures in which.

Figure 1:
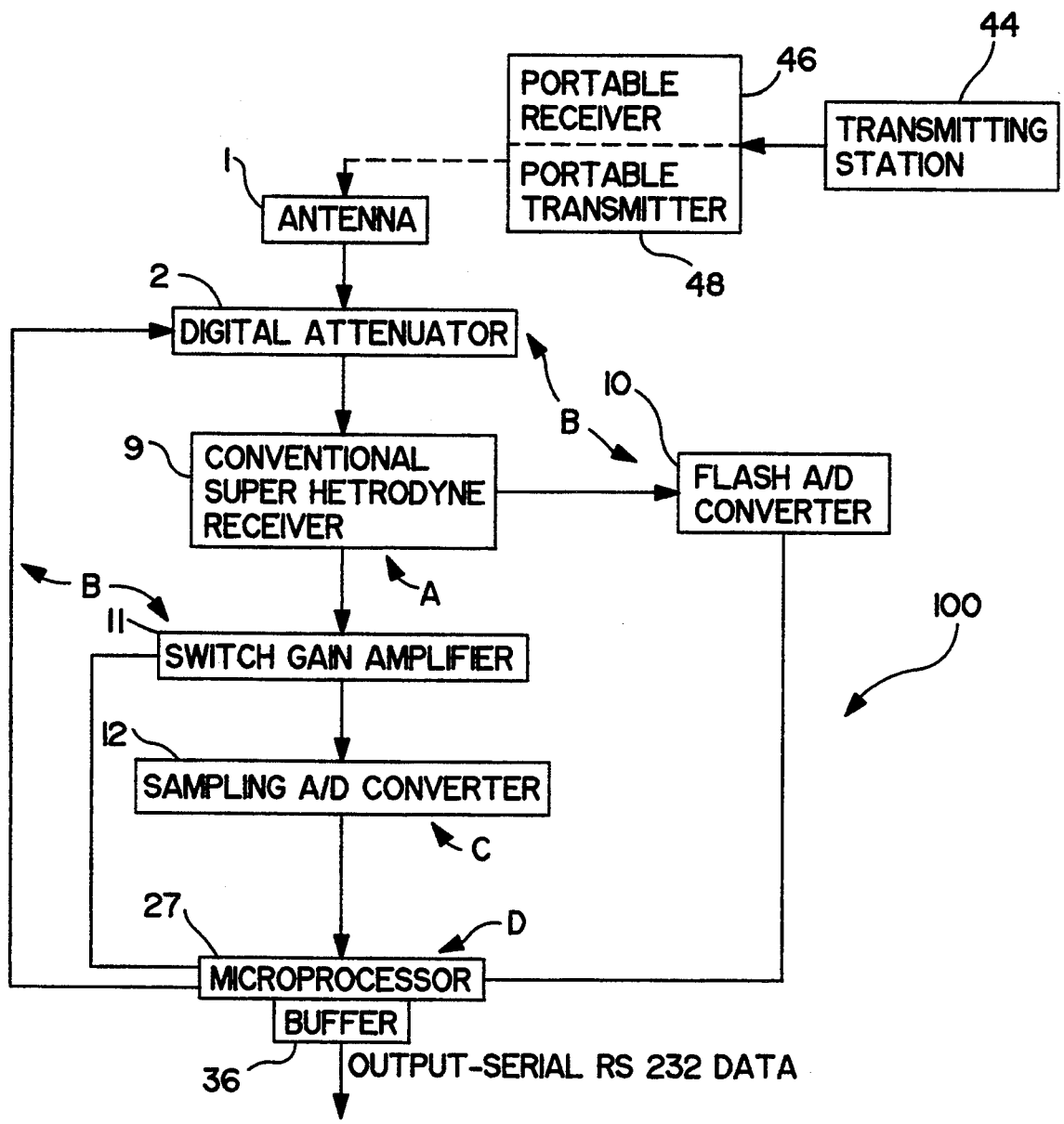
FIG. 1 is a block diagram illustrating the basic concepts of the apparatus and method of the present invention.

Repeat use of reference characters in the following specification and appended drawings is intended to represent the same or analogous features, elements, or steps of the present invention.

DETAILED DESCRIPTION OF THE PREFERRED EMBODIMENTS

Reference will now be made in detail to the presently preferred embodiments of the invention, one or more examples of which are illustrated in the accompanying drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents.

As discussed in the summary of the invention, the present invention is concerned with processing a weak signal in a congested spectrum. The conventional FSK discriminator consists of a detector and a bicromatic comparator circuit. For strong signals, signals having a S/N of 4:1, in the absence of spurious in-band interference the conventional FSK discriminator works reasonably well. However, the conventional discriminator is unsuited for a weak signal in a noisy background. One solution is to narrow the band width within which the logical events occur. For example, a logical "1" may be represented by a deviation of 4.8 Khz+/−100 hz, and a logical "0" may be represented by −4.8 Khz+/−100 hz. In this manner, the logical events may be distinguished even in a background of wide and narrow band noise, provided the narrow band noise does not fall within the pass band of the information signal. However, this system requires a bandpass circuit with a Q rating of at least 200. Using conventional analog components, an active filter with a Q rating of 200 would "ring" excessively and its decay rate would be longer than the bit rate for all but the slowest (less than 110 baud) transmission speeds. A Phase Lock Loop can achieve a Q rating of 200, but it requires and S/N of greater than 8 to achieve lock within a relatively moderate time.

It is possible to achieve the required performance specifications to process the weak signal utilizing a DSP architecture with a high speed sampling A/D converter.

Accordingly, a preferred embodiment of the present invention is outlined generally in FIG. 1. An incoming RF signal 0 is received into system 100 through, for example, conventional antenna 1. Receiver circuitry means, generally A, filters and mixes signal 0 to a desired predetermined frequency. Automatic gain control means, generally B, digitally attenuate signal 0 before the signal is processed by receiver circuitry means A so that any useful information contained in the signal will not be lost due to saturation and clipping within circuitry means A. Converter means, generally C, sample and digitize the output signal from receiver circuitry means A at a relatively high speed. Digital circuitry means, generally D, process the digitized signal from converter means C into useful digital information. Digital circuitry means D also controls automatic gain control means B. Variable gain amplifier, such as switch gain amplifier 11, may be included to raise the signal from receiver means A to a level sufficient for digitizing by converter means C.

For ease of explanation, the system and method of the present invention will be referenced in terms of an acknowledgement paging system whereby a personal pocket pager receives a page signal from a central transmitting station and transmits an acknowledgement signal to a receiving station. The receiving station may be located at the transmitting station. Due to the relatively small size of conventional personal pagers, the acknowledgement transmitter is small and unfortunately, relatively weak. The present invention is related to processing the relatively weak signal transmitted by the portable transmitter in a background of narrow band and wide band noise. It should be understood, however, that the present invention is not limited to the personal paging industry but, has applications in any long range RF telemetry system or any system concerned with processing weak RF radio frequency signals.

Figure 2:
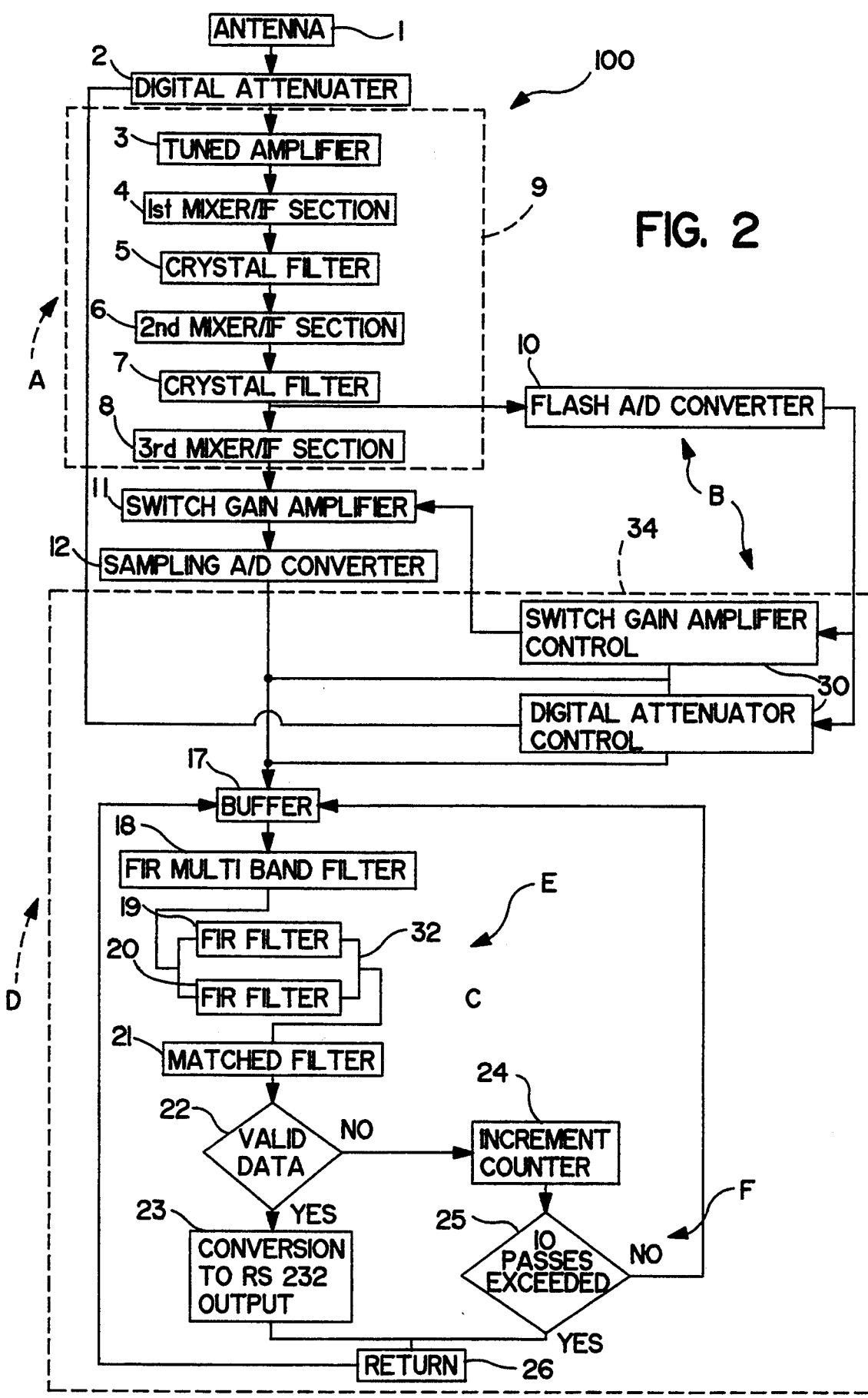
FIG. 2 is a detailed diagrammatic representation of the method and system according to the invention.

Referring to FIGS. 1 and 2 in particular, transmitting station 44 emits a signal received by portable receiver 46. Portable transmitter 48 issues an acknowledgement signal 0. Preferably, portable receiver 46 and transmitter 48 comprise a single unit, such as a personal pocket paging device. Digitally enhanced RF receiving system 100 receives the relatively weak signal 0 transmitted by transmitter 48. Unfortunately, signal 0 is generally weak due to the relatively small size of transmitter 48 and transmitted in a relatively noisy environment. Antenna 1 is the first element in system 100 and can comprise any suitable conventional antenna.

System 100 utilizes receiver circuitry means A for filtering and mixing analog signal 0 to a desired predetermined frequency, for example 18 khz. Circuitry means A may comprise any manner of conventional receiver systems, such as super heterodyne receiver 9 indicated in FIG. 1. In a preferred embodiment of the invention depicted in FIG. 2, receiver 9 preferably includes conventional tuned amplifier 3 followed by a first mixer/IF section 4. First mixer IF section 4 shifts the carrier frequency of the incoming signal 0 to a frequency for which a commercially available and relatively inexpensive crystal filter 5 can filter unwanted noise from signal 0. Receiver 9 also includes second mixer/IF section 6 stepping the carrier frequency of the signal to another standard intermediate frequency, for example 10.7 Mhz, for which another standard crystal filter 7 may be used for filtering still further noise from the signal. The output signal from second mixer/IF section 6 may also be at an audio frequency. Preferably, receiver 9 includes third mixer/IF section 8 for mixing the surviving group of signals down to about 18 Khz so that the signal can be effectively sampled by an analog to digital converter for subsequent digital filtering. It should be understood by one skilled in the art that receiver means A can comprise any manner of conventional receiver circuitry and that circuit 9 just described is merely illustrative of a typical heterodyne receiver which may be used in the present invention.

System 100 further includes automatic gain control means B for digitally attenuating the incoming signal 0 before the signal is processed by receiver 9. It is necessary to ensure that the front end of receiver 9 is not susceptible to input saturation caused by proximate out-band or in-band carriers. Input saturation of amplifier 3 is prevented by placing digitally programmable attenuator 2 upstream of receiver 9. The amount of attenuation from digital attenuator 2 is controlled by gain control digital processor 30. Digital gain control processor 30 comprises a portion of digital circuitry means D, particularly digital processor array 34.

Automatic gain control means B further includes a flash A/D converter 10 for sampling the output of digital attenuator 2 at the maximum rate allowed by processor 30. The output of flash A/D converter 10 is decoded by processor 30 which in turn controls digital attenuator 2 in response to the signal from A/D converter 10. If digital attenuator 2 reduces the incoming signal, the inverse of any such reduction is recorded by processor 30 and a corresponding scale factor is generated by the processor. Digital processor 30 applies the scale factor to the corresponding attenuated signal prior to the signal being stored in buffer 17 for further digital processing. In this manner, the signal is returned to its pre-attenuation magnitude.

Figure 3:
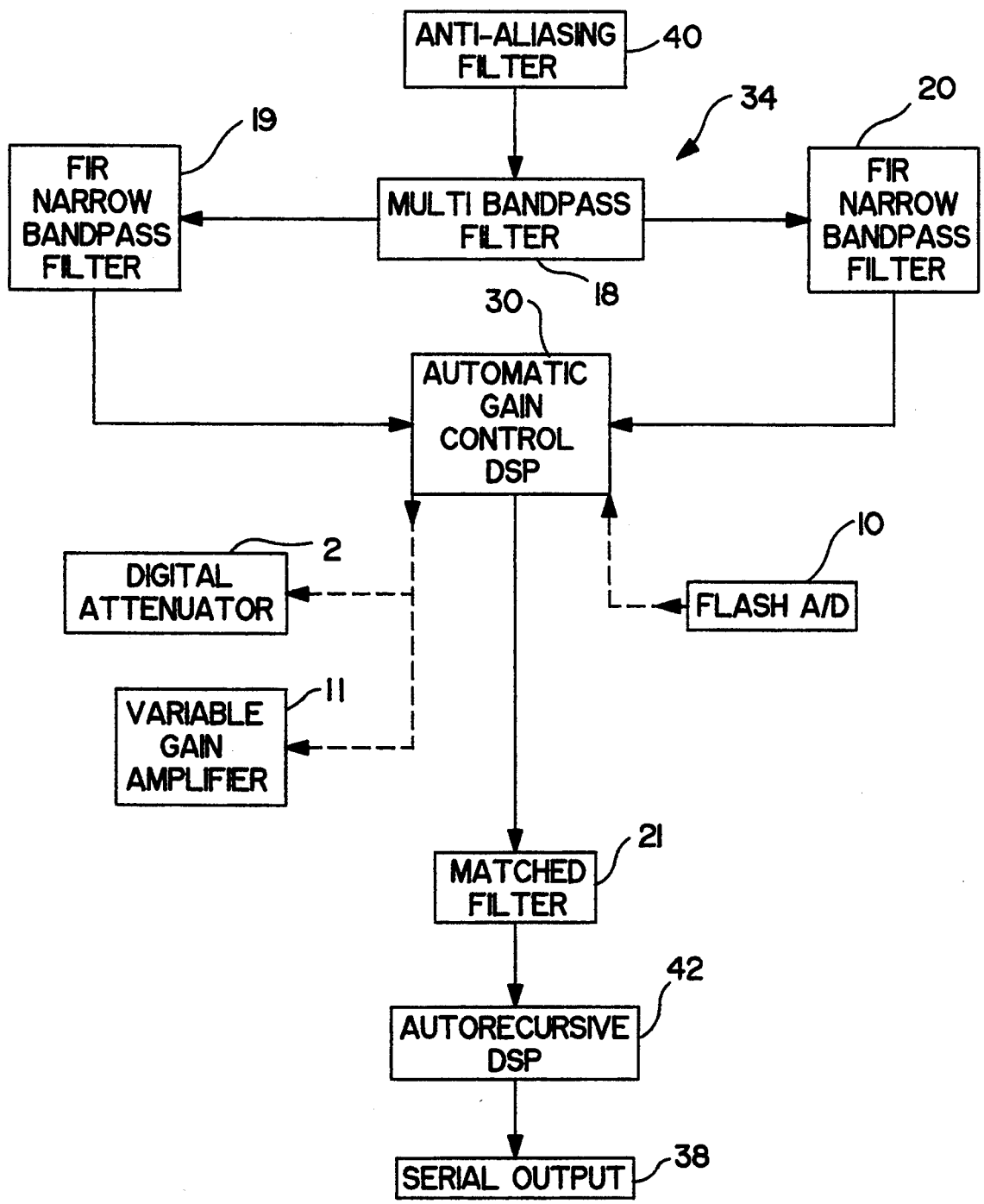
FIG. 3 is a detailed diagrammatic representation of the microprocessor array according to the invention.

Flash A/D converter 10 also informs gain control digital processor 30 of incoming signals that are so weak they would induce low end clipping of the sampling A/D converter 12. In this instance, system 100 preferably includes variable gain amplifier 11 which is also controlled by gain control digital processor 30. Variable gain amplifier 11 amplifies the signal when such low end clipping would occur and the inverse of any amplification is recorded and delayed by processor 30 with a corresponding scale factor being applied to the signal before entering buffer 17 to return the signal to its original magnitude. Operation of automatic gain control means B according to the invention is particularly diagrammed in FIG. 2 and FIG. 3. It should be understood by one skilled in the art that gain control digital processor 30 may comprise a single DSP as indicated in FIG. 3, or separate DSPs may be utilized as depicted generally in FIG. 2. Also, variable gain amplifier 11 may comprise a conventional gain amplifier, such as a switch tree RF amplifier network.

It is important to the present invention to have a relatively fast flash A/D converter 10 to prevent front-end saturation and clipping causing a loss of low level signal information. The front-end signal is a super positive sum of all of the signals within the band width of tuned amplifier 3. Conventional automatic gain control systems tend to average the input level of the signal and then overshoot the attenuation. This could result in loss of low level information. A relatively fast flash A/D converter, for example whose Nyquist rate is in excess of the second stage IF frequency, operating with digital processor 30 and digital attenuator 2 provides an automatic gain control system operating so fast that virtually no portion of the incoming signal is lost.

Digital RF receiving system 100 according to the invention further comprises converter means C for sampling and digitizing the output signal from receiver 9 at a predetermined rate. Converter means C preferably comprises a sampling A/D converter 12 for sampling the receiver output signal at preferably one and a half times the Nyquist rate. In essence, sampling A/D converter 12 takes a digital snapshot of the amplified output of receiver 9. The sampled signal is the frequency band-limited and level-limited super positive sum of the input frequencies. In a preferred embodiment of FIG. 2, sampling A/D converter 12 samples the output signal from third IF section 8. As discussed earlier, third mixer/IF section 8 mixes the analog signal down to a frequency more compatible with sampling A/D converter 12. The signal from receiver 9 may be sampled at a rate of approximately the Nyquist frequency if an anti-aliasing filter 40 is included before digital circuitry means D, as diagrammed in FIG. 3. Conventional anti-aliasing filters are relatively expensive though and it may be preferred to simply utilize a third mixer/IF section 8 as shown in FIG. 2.

In another preferred embodiment, it is possible to undersample the signal with sampling A/D converter 12 at a sub-Nyquist rate when the incoming signal is a bicromatic monotonic AM signal. Due to the characteristics of this type of signal, it is possible to sample at, for example, 20 Khz and dispense with third mixer/IF section 8 even though the Nyquist rate is in excess of 200 times the sample rate.

System 100 further includes digital circuitry means, generally D, for processing the digitized signal from A/D converter 12 into useful digital information. Digital circuitry means D preferably comprises a microprocessor 27 consisting essentially of an array 34 of digital signal processors. As discussed, at least one digital signal processor is configured as gain control digital processor 30 controlling digital attenuator 2 and variable gain amplifier 11. Digital processor array 34 is diagrammed generally in FIG. 3. Digital circuitry means D preferably includes at least one processor configured as a multi bandpass filter section 18. If, as discussed earlier, a logical "1" is represented by a deviation of 4.8 Khz+/−100 hz and a logical "0" is represented by −4.8 Khz+/−100 hz, then bandpass filter 18 would be configured with, for example, a 1 Khz band width centered on −4.7 Khz and +4.7 Khz for filtering the digital signal emerging from buffer 17. Multi-band FIR filter 18 may comprise a conventional Remez filter.

Microprocessor 27 further includes narrow band FIR filter section 32. In a preferred embodiment as depicted in FIGS. 2 and 3, narrow band filter section 32 comprises two Kaiser-Bessel narrow band filters 19 and 20 configured in parallel. Filters 19 and 20 narrow the passband to 4.7 khz and −4.7 khz+/−5 hz, respectively. To achieve such a narrow bandwidth without resonance, or "ringing" filters 19 and 20 are in parallel configuration. For example, two parallel ADSP2101 DSP microcomputers under the control of an 80c186 microcomputer may be provided with the 2101's performing the convolution sum required to implement a 540 tap FIR bandpass filter. Each filter 19 and 20 may also include a number of DSPs configured in parallel to increase the speed of the filters.

The above description of narrow band filters 19 and 20 is but a preferred embodiment of narrow band filter section 32. It should be understood by one skilled in the art that, if a strong and fast enough DSP is available, the filters need not be configured in parallel. Also, such a DSP could also implement filtering at both the +4.7

Khz and −4.7 Khz frequencies in serial fashion. However, it may be preferred from a cost and efficiency standpoint to arrange conventional DSPs in parallel to rapidly execute the filtering equation and to further configure two filters in parallel to further increase the speed of the filtering process.

Following narrow band filter section 32, microprocessor 27 also includes matched filter 21. Filter 21 may comprise a Wiener matched filter to filter wide band noise from the signal emerging from filters 18, 19, and 20. FIG. 3 depicts automatic gain control DSP 30 in line between matched filter 21 and filters 19 and 20. In this configuration, DSP 30 merely routes the signal through to matched filter 21.

Digital circuitry means D according to the invention also preferably includes multi-loop auto-recursive means F for flushing valid binary data from the filtered digitized signal. Preferably, at least one DSP 42 is configured to drive the auto-recursive loop. The auto-recursive loop is depicted generally in FIG. 2 and consists of steps 22 through 26. The purpose of auto-recursive means F is to check for a valid binary 1 or 0 in the filtered digitized signal. If such data is present in the signal, it is converted by microprocessor 27 at step 23 to RS 232 serial output data. If valid data is not present on the first pass through the loop, microprocessor 27 at step 24 advances one count. If that count is less than a predetermined number, for example 10, at step 25 the unfiltered signal is again retrieved from buffer 17 and driven through the loop once again. The signal is then filtered by filters 18 through 21 as before, however the passbands of the narrow band FIR filters 19 and 20 are shifted a predetermined amount, for example 10 hz. The process is repeated for ten passes of the signal. If no valid data is detected in ten passes, such that the passbands of filters 19 and 20 are shifted 50 hz above and below their original center frequencies, the microprocessor 27 continues to the next segment of information. The volume of the digitized signal passed through the filtering means is dependent upon the aperture window of sampling A/D converter 12.

As explained above, valid data is converted to serial RS 232 output and may be stored in buffer 36 for subsequent transfer. A serial interface is preferably provided for outputting the data as asynchronous data.

The method according to the present invention for digitally processing a signal in a noisy environment is practiced using the components described above. The method includes the steps of attenuating an incoming signal with a digital processor driving a digital attenuator prior to inputting the signal into a receiver so as to prevent saturation of the receiver and the loss of useful information from the signal. The method further includes processing the attenuated signal with a receiver for filtering and mixing the signal down to a desired frequency compatible with a sampling A/D converter. The processed signal from the receiver is then sampled and digitized with a sampling A/D converter at a predetermined rate, preferably at least one and a half times the Nyquist frequency. The digitized signal is then routed from the sampling A/D converter through a multi-pass filtering loop a predetermined number of times to flush valid binary data from the signal. The loop comprises an array of digital processors configured as a multi bandpass FIR filter section, a narrow band FIR bandpass filter section, and a matched filter section. Preferably, the method further includes configuring multiple DSPs in parallel as the narrow band FIR filters and further configuring at least two filters in parallel to maximize the speed of the digital circuitry. In this manner, a digital filtering circuit having a relatively high Q rating is provided with undesired ringing being virtually eliminated from the circuit. Finally, the method includes outputting valid binary data as serial data for further processing.

Additional embodiments of the method according to the present invention have already been discussed above and need not be repeated.

While particular embodiments of the invention have been described and shown, it will be understood by those of ordinary skill in this art that the present invention is not limited thereto since many modifications may be made. Therefore, it is contemplated by the present application to cover any and all such embodiments that may fall within the scope of the invention and the appended claims.

What is claimed is:

1. A digital discriminator circuit for processing a received analog signal in a noisy environment, said discriminator circuit comprising:
   a high speed A/D converter for sampling and digitizing the received signal at a predetermined rate;
   a microprocessor array of digital signal processors, said array comprising at least a finite impulse response bandpass filter section operably configured to receive and filter the digitized signal from said high speed A/D converter and a matched filter section operably downstream from said finite impulse response bandpass filter section for further filtering of the digitized signal, said microprocessor further comprising auto-recursive means for flushing valid binary data from the signal filtered through said finite impulse response bandpass filter section and said matched filter section; and
   automatic gain control means for attenuating the level of the received signal, said automatic gain control means comprising a digital attenuator, said microprocessor array comprising means for driving said digital attenuator, and a flash A/D converter for sampling the received signal at a rate compatible with said microprocessor array, said microprocessor array further comprising a means for comparing the strength of the signal from said flash A/D to a predetermined value and driving said digital attenuator in response thereto before useful information is lost from the received signal.

2. The circuit as in claim 1, wherein said high speed A/D converter operates at a sub-Nyquist rate.

3. The circuit as in claim 1, wherein said high speed A/D converter operates at least at the Nyquist rate.

4. The circuit as in claim 1, wherein said finite impulse response bandpass filter section has a Q rating of at least 200 so as to substantially eliminate ringing.

5. A method for digitally processing a signal in a noisy environment, comprising the steps of:
   inputting the signal into a receiver;
   attenuating the signal prior to said inputting with a digital attenuator driven by a digital processor to prevent saturation of the receiver and the loss of useful information from the signal;
   processing the attenuated signal with the receiver;
   sampling and digitizing the processed signal from the receiver with a sampling A/D converter at a predetermined rate;
   routing the digitized signal from the sampling A/D converter through a multi-pass loop a predetermined number of times, said loop comprising an array of digital processors configured as a multi-bandpass filter section operably configured to receive and filter the digitized signal from the sampling A/D converter, a narrow band finite impulse response bandpass filter section operably configured to receive and filter the digitized signal from the multi-bandpass finite impulse response filter section, and a matched filter section operably configured to receive the digitized signal from the narrow band finite impulse response bandpass filter section to flush valid binary data from the digitized signal; and outputting the valid binary data as serial data for further processing.

6. The process as in claim 5, wherein said attenuating comprises sampling and digitizing the signal with a flash A/D converter and driving the digital attenuator with a digital processor responding to the level of the sampled and digitized signal from the flash A/D converter.

7. The process as in claim 6, further comprising sampling and digitizing the signal with the flash A/D converter at the maximum rate of the digital processor.

8. The process as in claim 5, wherein said processing with a receiver comprises processing with a superheterodyne receiver having at least two mixer and intermediate frequency sections.

9. The process as in claim 8, wherein said receiver includes a third mixer and intermediate frequency section and said processing step includes mixing the received signal down to an optimum frequency for sampling by the sampling A/D converter.

10. The process as in claim 5, wherein said sampling and digitizing with the sampling A/D converter comprises undersampling the signal at a sub-Nyquist rate when the received signal is a monotonic amplitude modulation signal.

11. The process as in claim 5, wherein said sampling and digitizing with the sampling A/D converter comprises sampling the signal at least at the Nyquist rate.

12. The process as in claim 5, further comprising providing variable gain to the output signal of the receiver, the gain being matched to the initial level of the received signal.

13. The process as in claim 5, further comprising configuring the array of digital processors as a first multiband FIR filter, at least two narrow band finite impulse response filters configured in parallel, and a matched filter.

14. The process as in claim 13, further comprising configuring at least one of the narrow band finite impulse response filters with at least two of the digital processors in parallel.

15. The process as in claim 5, wherein said routing the digitized signal through the multi-pass loop of digital processors includes shifting the bandpasses of the filters before each pass of the digitized signal therethrough.

16. The process as in claim 5, including outputting the valid binary data as serial asynchronous data.

17. The process as in claim 5, including outputting the valid binary data as serial synchronous data.

18. A digitally enhanced receiving system for processing radio frequency signals, comprising:
an antenna for receiving an incoming RF signal;
a superheterodyne receiver for filtering and mixing the received signal, said receiver comprising
a first mixer and intermediate frequency section;
a first filter device connected in series with said first mixer and intermediate frequency section;
a second mixer and intermediate frequency section connected in series with said first filter device;
a second filter device connected in series with said second mixer and intermediate frequency section; and
a third mixer and intermediate frequency section connected in series with said second filter device;
automatic gain control means for attenuating the incoming signal before said signal is processed by said receiver, said automatic gain control means comprising
a flash A/D converter;
a digital signal processor; and
a digital attenuator, said flash A/D converter sampling the received signal at the output of said second mixer and intermediate frequency section at a rate substantially equal to the speed of said digital processor, said digital signal processor responding to the sampled signal from said flash A/D converter to drive said digital attenuator so as to attenuate said incoming radio frequency signal prior to said signal being processed by said receiver;
a variable gain amplifier for increasing the level of the signal emerging from said receiver, said variable gain amplifier being driven by said digital processor;
a sampling A/D converter for sampling and digitizing the signal emerging from said receiver at a rate of at least one and a half times the Nyquist rate;
a microprocessor array for processing useful information from the digitized signal emerging from said sampling A/D converter, said microprocessor array further comprising
a multiband finite impulse response bandpass filter operably configured to receive and filter the digitized signal from said sampling A/D converter;
at least two narrow band finite impulse response bandpass filters configured in parallel to receive and filter the digitized signal from said multiband finite impulse response bandpass filter;
a matched filter operably configured to receive and filter the digitized signal from said parallel narrow band finite impulse response bandpass filters; and
an auto-recursive loop for passing the digitized signal through said microprocessor array filters a predetermined number of passes to flush valid data therefrom, said microprocessor shifting the bandpass of said filters to change the characteristics thereof prior to each said pass of the digitized signal;
a buffer for storing valid binary data flushed from the digitized signal through said filters; and
means for outputting the valid binary data as serial data.

19. A digitally enhanced radio frequency receiving system for receiving and demodulating signals in a noisy environment, said system comprising:
receiver circuitry means for filtering and mixing an incoming analog signal;
automatic gain control means for digitally attenuating said incoming signal before said incoming signal is processed by said receiver circuitry means so that any useful information contained in said incoming signal will not be lost due to saturation of said receiver circuitry means, said automatic gain control means comprising a digital attenuator upstream from said receiver circuitry means, a flash A/D converter sampling the output from said digital attenuator before complete processing thereof by said receiver circuitry means, and a gain control digital processor in operative communication with said flash A/D converter and said digital attenuator, said flash A/D converter sampling at a rate compatible with said gain control digital processor, said gain control digital processor receiving the sampled and digitized signal from said flash A/D converter and driving said digital attenuator in response to said sampled and digitized signal;

converter means for sampling and digitizing the output signal from said receiver circuitry means at a predetermined rate; and digital circuitry means for processing the digitized signal from said converter means into useful digital information, said digital circuitry means further controlling said automatic gain control means.

20. The system as in claim 19, wherein said receiver circuitry means comprises at least a first and a second mixing stage and at least a first and a second intermediate frequency stage operably configured to filter and mix the incoming signal to a desired predetermined frequency, said flash A/D converter sampling the output of said second intermediate frequency stage.

21. The system as in claim 20, wherein said receiver circuitry means comprises a third mixing stage and third intermediate frequency stage.

22. The system as in claim 19, wherein said automatic gain control means further comprises a variable gain amplifier said gain control digital processor further comprising means for driving said variable gain amplifier so as to provide variable gain to the output signal of said receiver circuitry means, said gain being matched to the level of said incoming signal.

23. A digitally enhanced radio frequency receiving system for receiving and demodulating signals in a noisy environment, said system comprising:

receiver circuitry means for filtering and mixing an incoming analog signal;

automatic gain control means for digitally attenuating said incoming signal before said incoming signal is processed by said receiver circuitry means so that any useful information contained in said incoming signal will not be lost due to saturation of said receiver circuitry means;

converter means for sampling and digitizing the output signal from said receiver circuitry means at a predetermined rate; and digital circuitry means for processing the digitized signal from said converter means into useful digital information, said digital circuitry means further controlling said automatic gain control means, said digital circuitry means comprising narrow band and wide band digital filtering means for filtering the digitized signal from said converter means, and multi-loop auto-recursive means for flushing valid binary data by passing the digitized signal through said filtering means a predetermined number of passes.

24. The system as in claim 23, wherein said digital circuitry means comprises a microprocessor array of digital processors configured as a multi-band finite impulse response filter section, a narrow band finite impulse response filter section, and a matched filter section, said microprocessor array filters configured to receive and filter the digitized signal from said converter means, said multi-loop auto-recursive means shifting the pass bands of said filters prior to each pass of said digitized signal therethrough.

25. The system as in claim 24, wherein said narrow band finite impulse response filter section comprises at least two narrow band finite impulse response filters configured in parallel.

26. The system as in claim 25, wherein at least one of said narrow band finite impulse response filters comprises at least two digital processors configured in parallel.

27. A long range radio frequency transmitting and acknowledgement receiving system, comprising:

a transmitting station;

a remote portable receiver for receiving a radio frequency signal from said transmitting station;

a remote portable transmitter for transmitting an acknowledgement return signal to said transmitting station;

digital means at a receiving station for receiving and processing said return signal in the presence of narrow band and wide band interference, said digital receiving and processing means comprising:

receiver circuitry for filtering and mixing said return signal to a desired carrier frequency;

automatic gain control means operatively configured to attenuate said return signal to a level so as not to drive said receiver circuitry into saturation thereby preventing clipping of said return signal and the loss of useful information contained in said return signal, said automatic gain control means comprising a digital attenuator upstream from said receiver circuitry means, a flash A/D converter sampling the output from said digital attenuator before complete processing thereof by said receiver circuitry means, and a gain control digital processor in operative communication with said flash A/D converter and said digital attenuator, said flash A/D converter sampling at a rate compatible with said gain control digital processor, said gain control digital processor receiving the sampled and digitized signal from said flash A/D converter and driving said digital attenuator in response to said sampled and digitized signal;

converter means for sampling and digitizing the output signal from said receiver circuitry means at a predetermined rate; and digital circuitry means for processing the digitized signal from said converter means into useful digital information, said digital circuitry means further controlling said automatic gain control means.

28. The system as in claim 27, wherein said portable receiver and said portable transmitter comprise a personal acknowledgement paging device configured for receiving signals from said transmitting station and returning an acknowledgement signal to said transmitting station.

* * * * *